United States Patent [19]

Hasegawa et al.

[11] Patent Number: 4,651,344
[45] Date of Patent: Mar. 17, 1987

[54] VHF-UHF MIXER HAVING A BALUN

[75] Inventors: Makoto Hasegawa, Tokyo; Sadahiko Yamashita, Sagamihara, both of Japan

[73] Assignee: Matsushita Electric Industrial Co., Ltd., Japan

[21] Appl. No.: 688,644

[22] Filed: Jan. 3, 1985

[30] Foreign Application Priority Data

Jan. 13, 1984 [JP] Japan .................. 59-5009

[51] Int. Cl.⁴ .............................................. H04B 1/26
[52] U.S. Cl. .................................... 455/325; 455/327; 455/330
[58] Field of Search ....................... 455/325–327, 455/330; 333/26

[56] References Cited

U.S. PATENT DOCUMENTS

| | | | |
|---|---|---|---|
| 3,939,430 | 2/1976 | Dickens et al. | 455/327 |
| 4,293,956 | 10/1981 | Altstatt | 455/327 |
| 4,435,848 | 3/1984 | Sedlmair | 455/330 |
| 4,461,040 | 7/1984 | Dobrovolny | 455/327 |
| 4,541,124 | 9/1985 | Lacour et al. | 455/327 |
| 4,542,535 | 9/1985 | Bates et al. | 455/327 |

FOREIGN PATENT DOCUMENTS

| | | | |
|---|---|---|---|
| 134901 | 8/1984 | Japan | 333/26 |
| 146202 | 8/1984 | Japan | 455/327 |

Primary Examiner—Jin F. Ng
Attorney, Agent, or Firm—Lowe, Price, Leblanc, Becker & Shur

[57] ABSTRACT

In a VHF-UHF mixer having a balun formed by conductor patterns placed on a dielectric substrate, a choke coil is interposed between an input junction of the mixer and ground, and the input junction may be divided into two connecting portions which are respectively connected to mixing diodes and a diplexer, where a line having an inductance is interposed between the two connecting portions. The choke coil may be a conductor pattern which is interposed between one of the two connecting portions and ground. The balun comprises parallel coupling lines including first and second coupling lines which may be formed on different sides of a dielectric substrate. The substrate for the balun may be a different one from the substrate of the mixer body.

9 Claims, 11 Drawing Figures

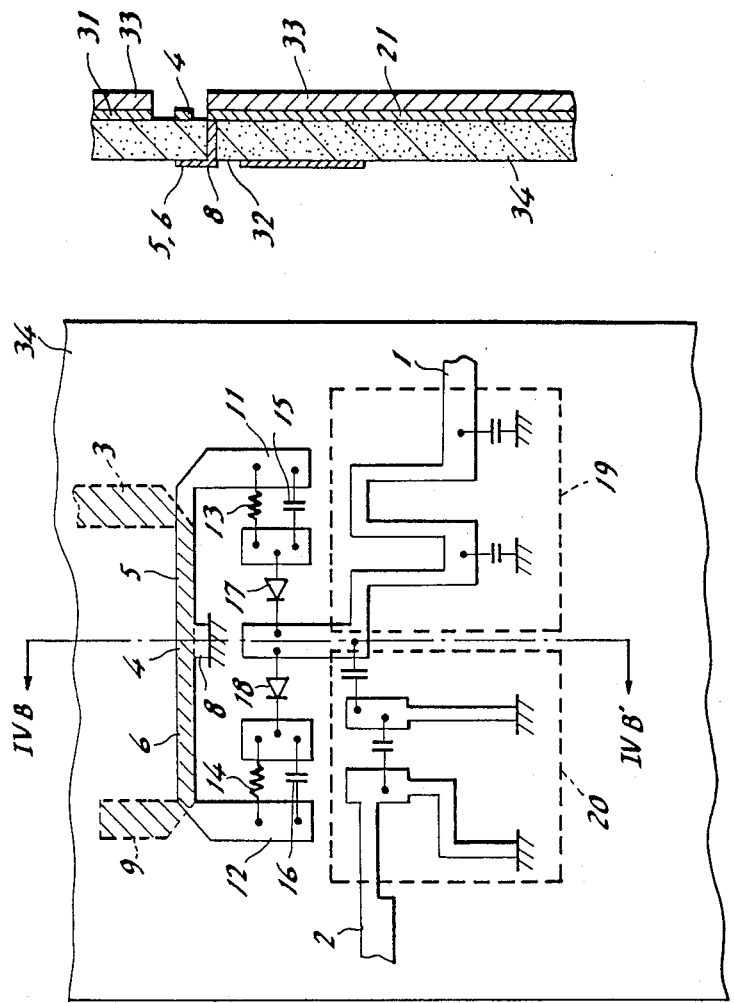

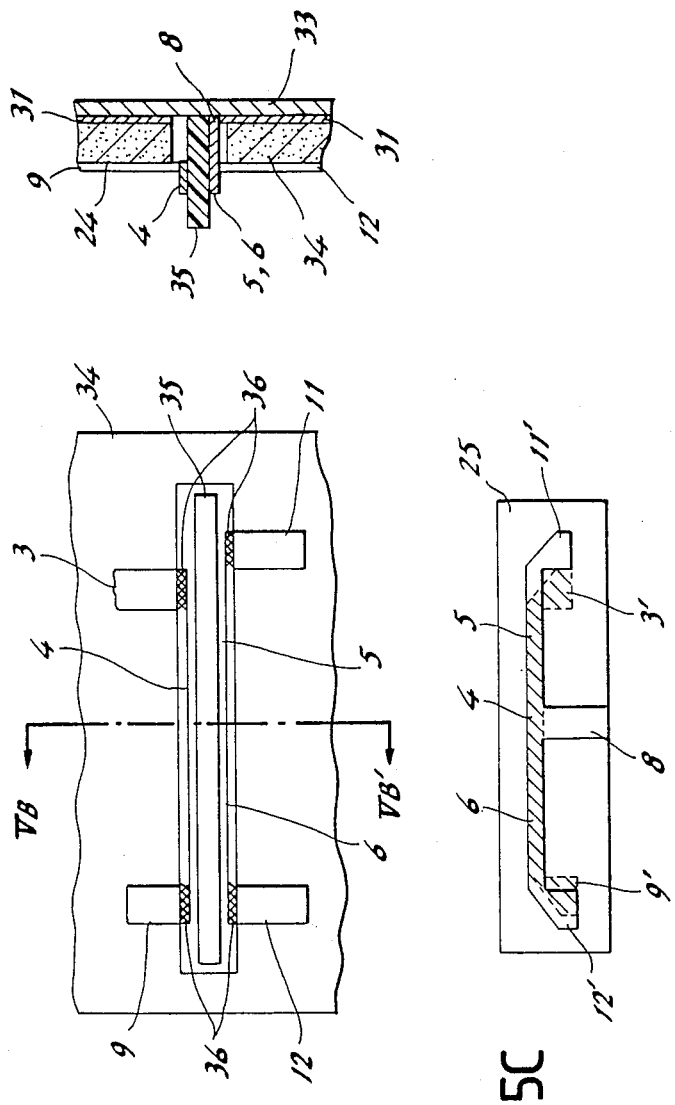

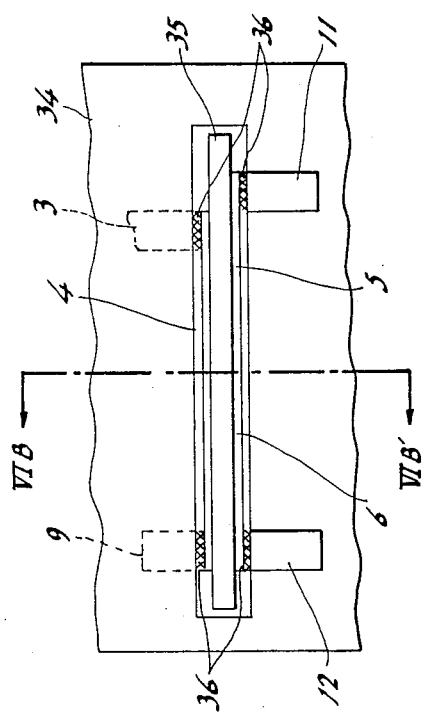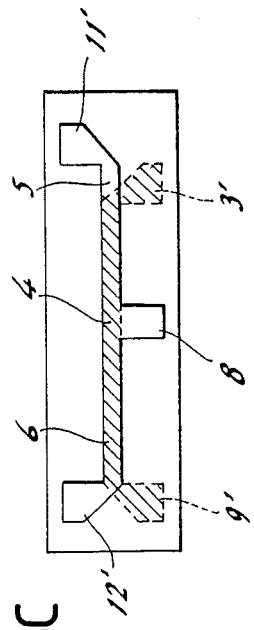

VHF-UHF MIXER HAVING A BALUN

BACKGROUND OF THE INVENTION

This invention relates generally to mixers of low distortion type, which are used for tuners or the like of cable television receivers.

In conventional mixers of this type, when transmitting power in VHF-UHF bands from an unbalanced circuit to a balanced circuit, an unbalanced current occurs at the connecting portion between these circuits and therefore spurious radiation and mismatching result. For this reason, a balun (Balanced to Unbalanced) is used to remove such drawback.

Most conventional baluns have a structure such that wires are wound spirally around a core of high permeability. However, such baluns suffer from considerable conversion loss when the frequency of an input signal is high. Furthemore, it is difficult to set the length of the wires to be wound so that phase difference between in-phase signal and antiphase signal is accurately 180 degrees. For these reasons, baluns are actualized recently by way of conductor patterns formed on a substrate without using wound wires.

However, such known conductor-pattern type baluns suffer from insufficient characteristics in connection with second order intermodulation distortion, while it is difficult to be mass produced with high accuracy as will be described in detail hereinlater.

SUMMARY OF THE INVENTION

The present invention has been developed in order to remove the above-described drawbacks inherent to the conventional mixers It is, therefore, an object of the present invention to provide a new and useful mixer which is superior in not only noise figure and third order intermodulation distortion characteristics but also in second order intermodulation distortion.

Another object of the present invention is to provide a mixer with a balun, which mixer is of low conversion loss and of low variations in characteristics, and can be manufactured without requiring high accuracy in pattern etching.

According to a feature of the present invention a choke coil is provided between ground and an input junction where an intermediate frequency is outputted using a local oscillator signal passed through a balun and an input signal in VHF-UHF bands. Furthermore, the input junction is divided into two connecting portions which are connected via a line having an inductor. The balun comprises parallel coupling lines including first and second coupling lines which may be formed on different sides of a substrate or a printed circuit board.

In accordance with the present invention there is provided a mixer of single-balanced type having a balun for outputting an intermediate frequency at an input junction using a local oscillator signal fed to an unbalanced circuit side of said balun, and a radio frequency signal inputted to said input junction which is connected to a balanced circuit side of said balun, wherein the improvement comprises a choke coil connected between said input junction and ground.

In accordance with the present invention there is also provided a balun comprising a first coupling line having a line for unbalanced circuit input at one end and an open-ended line at the other end, and a second coupling line whose midway point is grounded, said first and second coupling lines being formed respectively on different sides of a printed circuit board.

In accordance with the present invention there is further provided a mixer characterized by comprising a balun having a first coupling line having a line for inputting local oscillator signal at one end and an open-ended line at the other end, and a second coupling line having at its both ends open-ended balanced output lines which are provided at the both ends respectively for connecting elements of said mixer to an input juction, a midway point of said second coupling line being grounded, said first and second coupling lines forming parallel coupling lines which are formed respectively on different sides of a printed circuit board.

BRIEF DESCRIPTION OF THE DRAWINGS

The object and features of the present invention will become more readily apparent from the following detailed description of the preferred embodiments taken in conjunction with the accompanying drawings in which:

FIG. 4A shows a top plan view of a mixer of the first embodiment using a first embodiment of the balun portion;

FIG. 4B shows a cross-sectional view of the mixer shown in FIG. 4A;

FIGS. 5A to 5C show a second embodiment of the balun used in the first embodiment mixer of FIG. 2, and FIG. 5A is a top plan view, FIG. 5B being a cross-sectional view, FIG. 5C being a top plan view of only an additional substrate; and FIGS. 6A to 6C show a third embodiment of the balun used in a third embodiment mixer, and FIG. 6A is a top plan view, FIG. 6B being a cross-sectional view, FIG. 6C being a top plan view of only an additional substrate.

The same or corresponding elements and parts are designated at like reference numerals throughout the drawings.

DETAILED DESCRIPTION OF THE INVENTION

Prior to describing embodiments of the present invention, conventional devices will be described with reference to FIG. 1 for a better understanding of the present invention.

Figure 1:
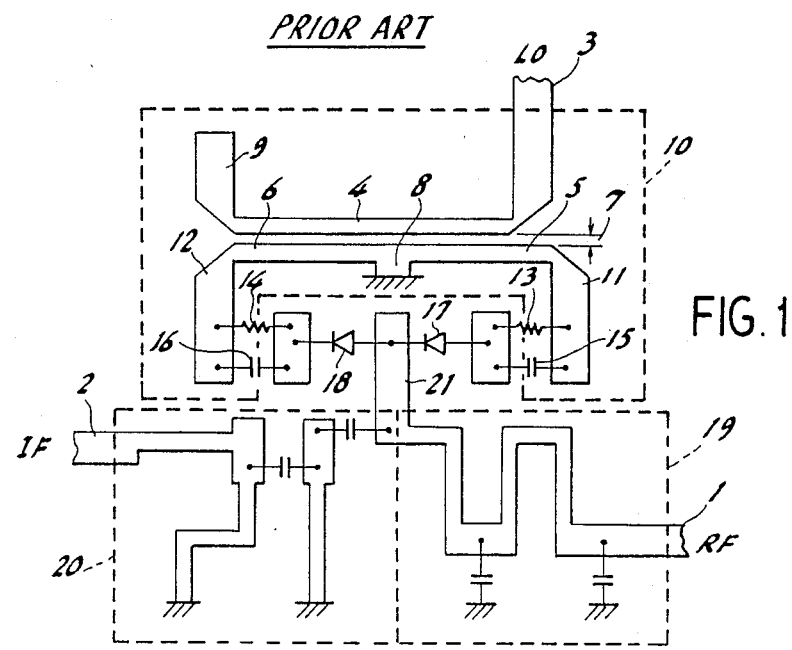
FIG. 1 shows a schematic arrangement of patterns of a conventional mixer.

FIG. 1 shows schematically an arrangement of patterns forming a conventional diode mixer of single balanced type which comprises a balun formed by conductor patterns on a dielectric substrate. The references 1, 2 and 3 are respectively a signal input terminal, a terminal for deriving an intermediate frequency signal, and a terminal for inputting a local oscillator signal which are all formed of microstrips or striplines of 50 ohms. A first coupling line 4 and second coupling lines 5 and 6, which are spaced apart by a pattern gap 7, function as parallel coupling lines. A junction between the second coupling lines 5 and 6 is grounded by way of a grounding line 8.

The reference 9 is an open-ended stub which forms a balun 10 at the local oscillator frequency band together with the parallel coupling lines 4, 5 and 6, and the grounding line 8.

To one output line 11 of the balun 10 is connected one end of a parallel circuit of a resistor 13 and a capacitor 15, while one end of another parallel circuit of a resistor 14 and a capacitor 16 is connected to another output line 12 of the balun 10. A series circuit of two diodes 17 and 18 connected such that cathode of one diode is connected to anode of the other, is interposed between the other ends of the above-mentioned two parallel circuits. The references 19 and 20 are parts forming a diplexer for separating input and output signals from each other. More specifically, the part 19 is a low pass filter for input radio frequency signal (RF), while the other part 20 is a high pass filter for output intermediate frequency signal (IF). A portion where the local oscillator signal passed through the balun 10 is mixed with the input radio frequency signal is an input junction of the mixer, and this input juction is formed by a first connecting portion between the cathode and anode of the diodes 17 and 18 and by a second connecting portion between the parts 19 and 20 of the diplexer. This input junction is actualized by a conductor pattern 21.

Although the mixer shown in FIG. 1 provides relatively satisfactory noise figure (NF) and third order intermodulation distortion characteristics, there has been a drawback that a desired characteristic for second order intermodulation distortion could not be obtained.

Figure 2:
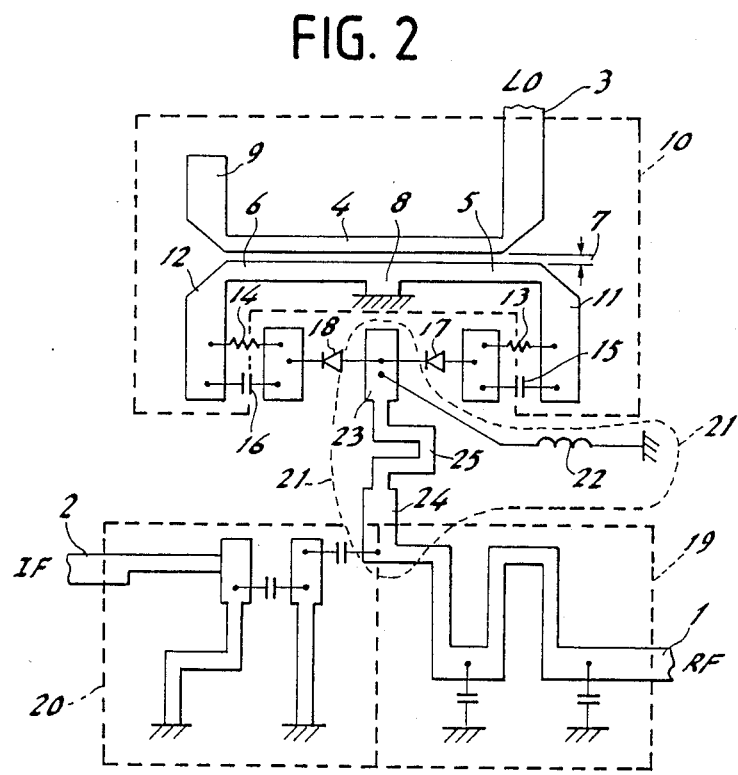
FIG. 2 shows a schematic arrangement of patterns of a mixer according to a first embodiment of the present invention.

Referring now to FIG. 2 an arrangement of patterns according to a first embodiment diode mixer according to the present invention is shown. The references 1, 2 and 3 are respectively a signal input terminal, a terminal for deriving an intermediate frequency signal, and a terminal for inputting a local oscillator signal which are all formed of microstrips or striplines of 50 ohms. A first coupling line 4 and second coupling lines 5 and 6 which are spaced apart by a pattern gap 7 form parallel coupling lines. A junction between the second coupling lines 5 and 6 is grounded by way of a grounding line 8. The reference 9 is an open-ended stub which forms a balun 10 at the local oscillator frequency band together with the parallel coupling lines 4, 5 and 6, and the grounding line 8.

To one output line 11 of the balun 10 is connected one end of a parallel circuit of a chip resistor 13 and a chip capacitor 15, while one end of another parallel circuit of a chip resistor 14 and a chip capacitor 16 is connected to another output line 12 of the balun 10. A series circuit of two Schottky barrier diodes 17 and 18 connected such that cathode of one diode is connected to anode of the other, is interposed between the other ends of the above-mentioned two parallel circuits. The references 19 and 20 are parts forming a diplexer for separating input and output signals from each other. More specifically, the part 19 is a low pass filter for input radio frequency signal (RF), while the other part 20 is a high pass filter for output intermediate frequency signal (IF).

The mixer shown in FIG. 2 differs from the conventional one shown in FIG. 1 in that the input junction of the mixer is divided into two parts, one being a first connecting portion 23 between the cathode and anode of the diodes 17 and 18, and the other being a second connecting portion 24 between the parts 19 and 20 of the diplexer used for separating input and output signals from each other. The first connecting portion 23 is grounded via a choke coil 22, while a line 25 having an inductance is interposed between these first and second connecting portions 23 and 24.

With the above circuit arrangement, the correction of the impedance at the input junction 21 can be peformed throughout a wide band using the line 25 having an inductance, and therefore, characteristics of intermodulation distortion of second and third orders can be bettered. The first junction 23 is of open circuit in connection with radio frequency due to the presence of the choke coil 22, and is regarded that it is grounded via a low impedance in connection with d.c. current. As a result, the degree of balancing operation as a mixer can be improved, and therefore second order intermodulation distortion characteristic can be bettered.

Figure 3:
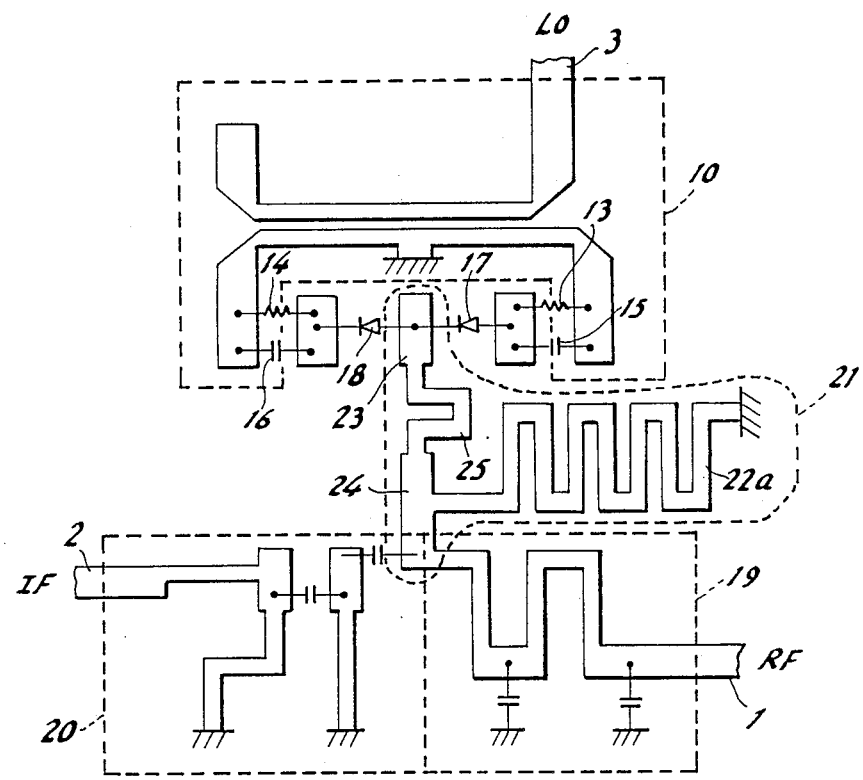
FIG. 3 shows a schematic arrangement of patterns of a mixer according to a second embodiment of the present invention.

FIG. 3 shows an arrangement of patterns of a second embodiment mixer. The second embodiment differs from the above-described first embodiment in that the choke coil is interposed between the second connecting portion 24 and ground rather than between the first connecting portion 23 and ground, and in that the choke coil is formed of a conductor pattern 22a.

In this way as long as the choke coil is of low impedance with d.c. and of sufficiently high impedance with a high frequency, the style or sort of the choke coil is not limited to that shown in FIG. 2. Furthermore, the choke coil 22 or 22a may be connected to either the first junction 21, i.e. diode connecting portion, or the second junction 24, i.e. diplexer connecting portion.

From the above it will be understood that it is possible to actualize low noise and low distortion characteristics by the mixer in which a line 25 having an inductance is connected to the input juntion 21 while a choke coil 22 or 22a for grounding through a low impedance in connection with d.c. current is provided, and by selecting the value of the resistors 13 and 14, and capacitors 15 and 16.

In the above embodiment, although the line 25 having an inductance is used, such a line 25 may be short-circuited, namely, such a line 25 is not required to be provided in a particular case where a combined impedance of the balanced circuit side of the balun 10 and mixing diodes 17 and 18 is equal to the impedance of the parts 19 and 20 of the diplexer. However, it is usually difficult to obtain such impedance matching throughout a wide frequency range, and therefore the line 25 having an impedance is usually necessary.

FIGS. 4A and 4B show a top plan view and a cross-sectional view of only the portion of the balun of a third embodiment mixer. The cross-sectional view of FIG. 4B is taken along a center line IVB—IVB' which passes through the center of a grounding line 8 in FIG. 4A. The balun 10 used in this embodiment differs from those of the previous embodiments in that the the first coupling line 4 and the second coupling lines 5 and 6 are respectively formed on different sides of the substrate 34 on which various elements of the balun are formed. In FIG. 4A, a portion which is on the back side is shown by hatching. The first line 4 and the second lines 5 and 6 are not required to be accurately overlapped each other. In other words, the first line 4 may be shifted from the position of the second lines 5 and 6 depending on a desired coupling degree. A junction between the second lines 5 and 6 is grounded by way of a grounding line 8. The reference 9 is an open-ended stub which forms a balun 10 at the local oscillator frequency band together with the parallel coupling lines 4, 5 and 6, and the grounding line 8.

To one output line 11 of the balun 10 is connected one end of a parallel circuit of a chip resistor 13 and a chip capacitor 15, while one end of another parallel circuit of a chip resistor 14 and a chip capacitor 16 is connected to another output line 12 of the balun 10. The value of the resistors 13, 14 and the capacitors 15, 16 are selected so as to actualize low distortion characteristic without increasing conversion loss. A series circuit of two Schottky barrier diodes 17 and 18 connected such that cathode of one diode is connected to anode of the other, is interposed between the other ends of the above-mentioned two parallel circuits. The references 19 and 20 are parts of a diplexer for separting input and output signals from each other. More specifically, the part 19 is a low pass filter for input radio frequency signal (RF), while the other part 20 is a high pass filter for output intermediate frequency signal (IF).

The grounding line 8 is connected to an earth pattern 31 and chassis 33, as seen in FIG. 4B, via shorting plate 32 inserted in a through-hole made in the substrate 34.

When coupling lines are formed on both sides of the substrate 34, there is a fear of disadavantage on construction of a stripline since the earth pattern 31 cannot be provided as an entire surface earth pattern due to the presence of the coupling line 4 on the side of the earth pattern 31. However, the arrangement of FIG. 4 in which the earth pattern 31 is not an entire surface earth pattern due to the presence of the coupling line 4 is not disadvantageous compared to the case of FIGS. 2 and 3 because the earth pattern on the other side of coupling liens 4, 5 and 6 of FIGS. 2 and 3 is partially removed with a width of approximately 2 to 3 millimeters since capacitance between the earth pattern and the coupling lines 4, 5 and 6 causes the increase in conversion loss in the arrangement of FIGS. 2 and 3 where the conductor patterns of the balun are formed on only one side of the substrate.

When the above-described technique of forming conductor patterns of a balun on both sides of a substrate is employed, a high precision of etching of the order of 100 micrometers for forming pattern gap is not any more required, and therefore mass production at low cost is now possible.

FIGS. 5A to 5C and 6A to 6C show second and third embodiments of the balun portion. FIGS. 5A and 6A are top plan views, FIGS. 5B and 6B being cross-sectional views taken along the lines VB—VB' and VIB—VIB' respectively, FIGS. 5C and 6C showing top plan views of another substrate.

In the case of FIGS. 5A to 5C, the parallel coupling lines 4, 5 and 6 are formed on a dielectric substrate (circuit board) 35 which is different from the substrate (circuit board) 34 of the mixer body. The substrate 35 carrying the parallel coupling lines 4–6 is attached such that its one edge is received in a groove made in the surface of the substrate 34 of the mixer body. As a result, the substrate 35 is supported at a right angle with respect to the other substrate 34. On one surface of the substrate 35 are formed the first coupling line 4, a portion of 50-ohms stripline 3 and a portion of an open-ended stub 9. On the other surface of the substrate 35 are formed the second coupling lines 5 and 6, a grounding line 8, and a portion of the output lines 11 and 12 of the balun.

Respective lines 3, 9, 11 and 12 to be connected to conductors on the mixer substrate 34 are connected to lines 3', 9', 11' and 12' by means of solder 36. Since the substrate 35 does not have a stripline structure where one surface of the substrate is entirely covered by an earth conductor, it is desired that an area of lines, which are not coupled with lines on the other side of the substrate 35, is as small as possible in view of mounting. In addition, lines other than the parallel coupling lines 4, 5 and 6 are desired to be arranged so that the degree of coupling at the front and rear of the substrate is as small as possible as shown in FIG. 5C like the case between lines 3' and 11' and between lines 9' and 12'. The grounding line 8 is connected to the earth plate 31.

Although this embodiment requires the separate or additional dielectric substrate 35, the use of the separate substrate 35 gives freedom in circuit arrangement. As a result, the material and the thickness of the substrate used for the balun, which is an important portion within a mixer in view of achieving low distortion, can be changed from those of the substrate of the mixer. In addition, the length of the grounding line 8 can be made shorter than that in the arrangement of connecting from one side to the other side of the substrate.

Furthermore, the scattering in characteristics when mounting can be relativley small, and it is advantageous that the length of the grounding line 8 is short because it leads to satisfactory balancing and therefore to low distortion. This embodiment does not require sophisticated etching techniques and therefore mass production of the mixers is possble in the same manner as in the previous embodiements.

In the further embodiment of FIGS. 6A to 6C, the substrate 35 is received in a through-hole made in the substrate 34 so that both edges of the substrate 35 protrude from the front and rear surfaces of the substrate 34 respectively. As will be understood from FIGS. 6A and 6B, the lines 3 and 9 at the local oscillator signal side are formed on one side of the substrate 34 while output lines 11 and 12 of the balun are formed on the other side of the substrate 34. In this embodiment, the length of the grounding line 8 can be further reduced.

In this way when parallel coupling lines forming a balun used for a mixer handling a frequency of several GHz are formed on both sides of a printed circuit board or substrate, the scattering in characteristics of the balun per se and mixer including such a balun can be reduced. As a result, balancing of the balun is readily obtained while it is possbile to provide mixers of low distortion and low noise which can be mass produced at a low cost without requiring sophisticated etching techniques.

What is claimed is:

1. In a mixer of single-balanced type having a balun for outputting an intermediate frequency from an input junction using a local oscillator signal fed to an unbalanced circuit side of said balun and a radio frequency signal inputted to said input junction, said input juction connected to a balanced circuit side of said balun, wherein said balun is formed of a first coupling line between an input for said local oscillator signal and an open end stub, a pair of second coupling lines separated from said first coupling line by a gap, and a grounding line for said second coupling lines, the improvement comprising a choke coil
said choke coil connected between said input junction and ground,
said input junction comprising a junction connecting an input for said radio frequency signal and diodes connected to output lines of said balun, said output lines being respectively connected to said second coupling lines.

2. A mixer as claimed in claim 1, wherein said input junction comprises:
 (a) a first connecting portion which is a junction between two mixing diodes;
 (b) a second connecting portion which is a junction between a low pass filter of a radio frequency input side and a high pass filter of an intermediate frequency output side; and
 (c) a line having an inductance, which is interposed between said first and second connecting portions.

3. A mixer as claimed in claim 2, wherein said choke coil is interposed between said first connecting portion and ground.

4. A mixer as claimed in claim 2, wherein said choke coil is interposed between said second connecting portion and ground.

5. A balun comprising a first coupling line having a line for unbalanced circuit input at one end and an open-ended line at the other end, and a second coupling line whose midway point is grounded, said first and second coupling lines being formed respectively on different sides of a substrate, both ends of each of said first and second coupling lines being connected via conducting members to lines on another substrate which is connected to said first-mentioned substrate.

6. A balun as claimed in claim 5, further comprising balanced output lines of open ended type, which are provided at both ends of said second coupling lines, respectively, for connecting external circuits to an input junction formed between diodes connected to said respective output lines and connected to receive a radio frequency signal input.

7. A balun comprising a first coupling line having a line for unbalanced circuit input at one end and an open-ended line at the other end, and a second coupling line whose midway point is grounded, said first and second coupling lines being formed respectively on different sides of a substrate, said substrate comprising first and second substrate where said second substrate is substantially normal to said first substrate, said first and second coupling lines being formed respectively on both sides of said second substrate, both ends of each of said first and second coupling lines being connected via conducting members to lines on said first substrate, 8. A mixer characterized by comprising a balun having a first coupling line having a line for inputting a local oscillator signal at one end and an open-ended line at the other end, and a second coupling line having at its both ends open-ended balanced output lines which are provided at the both ends respectively for connecting circuit elements of said mixer to an input junction, a midway point of said second coupling line being grunded, said first and second coupling lines forming parallel coupling lines which are formed respectively on different sides of a first substrate, said first substrate connected to a second substrate on which lines other than said parallel coupling lines of said mixer are formed.

9. A mixer as claimed in claim 8, wherein said substrate of said mixer comprises a first substrate and a second substrate which is attached to said first substrate such that said second substrate make a substantially right angle with respect to said first substrate, said first and second coupling lines being formed on both sides of said second substrate, both ends of said first and second coupling lines being connected via conducting members to lines on said first substrate.

* * * * *